(12) United States Patent
Buynoski

(10) Patent No.: US 6,667,552 B1
(45) Date of Patent: *Dec. 23, 2003

(54) LOW DIELECTRIC METAL SILICIDE LINED INTERCONNECTION SYSTEM

(75) Inventor: Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/252,186

(22) Filed: Feb. 18, 1999

(51) Int. Cl.[7] ............................................. H01L 23/48
(52) U.S. Cl. .................. 257/758; 257/768; 257/774
(58) Field of Search ........................ 257/758, 768–770

(56) References Cited

U.S. PATENT DOCUMENTS

| | | | | |
|---|---|---|---|---|
| 4,898,841 A | * | 2/1990 | Ho | ............................... 437/200 |
| 4,954,214 A | * | 9/1990 | Ho | ............................... 156/628 |
| 5,117,276 A | | 5/1992 | Thomas et al. | |
| 5,413,962 A | | 5/1995 | Lur et al. | |
| 5,483,104 A | * | 1/1996 | Godinho et al. | ............ 257/758 |
| 5,708,303 A | | 1/1998 | Jeng | |
| 5,882,963 A | * | 3/1999 | Kerber et al. | ............... 438/195 |
| 5,900,668 A | * | 5/1999 | Wollesen | .................... 257/758 |
| 5,936,295 A | * | 8/1999 | Havenmann et al. | ....... 257/760 |
| 5,950,102 A | * | 9/1999 | Lee | ............................ 438/619 |
| 5,953,626 A | * | 9/1999 | Hause et al. | ................. 438/622 |
| 6,037,248 A | * | 3/2000 | Ahn | ........................... 438/619 |

FOREIGN PATENT DOCUMENTS

GB     2 247 986     3/1992

* cited by examiner

*Primary Examiner*—Ori Nadav

(57) ABSTRACT

Multi-level semiconductor devices are formed with reduced parasitic capacitance without sacrificing structural integrity or electromigration performance by removing the inter-layer dielectrics and depositing a metal silicide to line the interconnection system. Embodiments include a semiconductor device comprising a dielectric sealing layer, e.g., silicon nitride, between the substrate and first patterned metal layer, tungsten silicide lining the interconnection system and dielectric protective layers, e.g., a silane derived oxide bottommost protective layer, on the uppermost metallization level.

31 Claims, 4 Drawing Sheets

LOW DIELECTRIC METAL SILICIDE LINED INTERCONNECTION SYSTEM

RELATED APPLICATIONS

This application contains subject matter similar to subject matter disclosed in U.S. patent applications Ser. No. 09/225,542 filed on Jan. 5, 1999 now U.S. Pat. No. 6,255,735, Ser. No. 09/252,184 filed on Feb. 18, 1999 now U.S. Pat. No. 6,218,282, Ser. No. 09/252,185 filed on Feb. 18, 1999 now U.S. Pat. No. 6,246,118, and Ser. No. 09/252,183 filed on Feb. 18, 1999 now U.S. Pat. No. 6,245,658.

TECHNICAL FIELD

The present invention relates to a semiconductor device with reduced capacitance loading, and to a method of manufacturing the semiconductor device. The invention has particular applicability in manufacturing high density, multi-level semiconductor devices comprising submicron dimensions.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect ratios due to miniaturization.

Conventional semiconductor devices typically comprise a semiconductor substrate, typically undoped monocrystalline silicon, and a plurality of sequentially formed inter-layer dielectrics and patterned metal layers. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink into the deep submicron range.

A conductive plug filling a via opening is typically formed by depositing an inter-layer dielectric on a patterned conductive (metal) layer comprising at least one metal feature, forming an opening in the inter-layer dielectric by conventional photolithographic and etching techniques, and filling the opening with a conductive material, such as tungsten (W). Excess conductive material on the surface of the inter-layer dielectric is removed by chemical-mechanical polishing (CMP). One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line.

High performance microprocessor applications require rapid speed of semiconductor circuitry. The speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RC delay caused by the interconnect wiring increases. If the interconnection node is routed over a considerable distance, e.g., hundreds of microns or more, as in submicron technologies, the interconnection capacitance limits the circuit node capacitance loading and, hence, the circuit speed. As design rules are reduced to about 0.18 micron and below, the rejection rate due to integrated circuit speed delays severely limits production throughput and significantly increases manufacturing costs. Moreover, as line widths decrease, electrical conductivity and electromigration resistance become increasingly important.

As device geometries shrink and functional density increases, it becomes increasingly imperative to reduce the capacitance between metal lines. Line-to-line capacitance can build up to a point where delay time and cross talk may hinder device performance. Reducing the capacitance within multi-level metallization systems will reduce the RC constant, cross talk voltage, and power dissipation between the lines.

One way to increase the speed of semiconductor circuitry is to reduce the resistance of a conductive pattern. Conventional metallization patterns are typically formed by depositing a layer of conductive material, notable aluminum or an alloy thereof, and etching, or by damascene techniques wherein trenches are formed in dielectric layers and filled with conductive material. The use of metals having a lower resistivity than aluminum, such as copper, engenders various problems which limit their utility. For example, copper readily diffuses through silicon dioxide, the typical dielectric material employed in the manufacture of semiconductor devices, and adversely affects the devices. In addition, copper does not form a passivation film, as does aluminum. Hence, a separate passivation layer is required to protect copper from corrosion.

The dielectric constant of materials currently employed in the manufacture of semiconductor devices for an inter-layer dielectrics (ILD) spans from about 3.9 for dense silicon dioxide to over 8 for deposited silicon nitride. Prior attempts have been made to reduce the interconnect capacitance and, hence, increase the integrated circuit speed, by developing dielectric materials having a lower dielectric constant than that of silicon dioxide. New materials having low dielectric constants, such as low dielectric constant polymers, teflon and porous polymers, have been developed. There has been some use of certain polyimide materials for ILDs which have a dielectric constant slightly below 3.0.

Recent attempts have also resulted in the use of low-density materials, such as an aerogel, which has a lower dielectric constant than dense silicon oxide. The dielectric constant of a porous silicon dioxide, such as an aerogel, can be as low as 1.2, thereby potentially enabling a reduction in the RC delay time. However, conventional practices for producing an aerogel require a supercritical drying step, which increases the cost and degree of complexity for semiconductor manufacturing. Moreover, the use of an aerogel results in a semiconductor device which lacks sufficient structural integrity.

Prior attempts to reduce parasitic RC time delays also include the formation of various types of air gaps or bridges.

See, for example, Lur et al., U.S. Pat. No. 5,413,962, Jeng, U.S. Pat. No. 5,708,303 and Saul et al., UK Patent GB2, 247,986A. However, the removal of ILD material becomes problematic in various respects. Firstly, the removal of ILD material adversely impacts the structural integrity of the resulting semiconductor device rendering it unduly fragile. Secondly, the removal of ILD material results in a significant reduction in electromigration resistance of the conductors due to exposed free surfaces.

Accordingly, there exists a need for a semiconductor device having reduced parasitic RC time delays with reduced internal capacitance without sacrificing structural integrity and/or electromigration performance.

DISCLOSURE OF THE INVENTION

An advantage of the present invention is a semiconductor device exhibiting reduced parasitic RC time delays without sacrifice of structural integrity and/or electromigration performance.

Another advantage of the present invention is a method of manufacturing a semiconductor device exhibiting reduced parasitic RC time delays without sacrifice of structural integrity and/or electromigration performance.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device comprising a substrate having active regions; and an interconnection system comprising: a first patterned metal layer, comprising metal features, over the substrate; a plurality of patterned metal layers, each patterned metal layer containing metal features, over the first patterned metal layer terminating with an uppermost patterned metal layer; vias electrically connecting metal features of different patterned metal layers; contacts electrically connecting active regions to metal features of the First patterned metal layer; air gaps between the patterned metal layers, metal features, and vias; and a metal silicide liner on the metal features and vias.

Another aspect of the present invention is a method of manufacturing a semiconductor device, the method comprising: forming a substrate with active regions; forming an interconnection system comprising: a first patterned metal layer, over the substrate, having metal features electrically connected to active regions by contacts; a plurality of patterned metal layers over the first patterned metal layer terminating with an uppermost patterned metal layer, each patterned metal layer having metal features electrically connected to metal features of different patterned metal layers by vias; and an inter-layer dielectric between patterned metal layers; removing the inter-layer dielectrics; and depositing a metal silicide to form a liner on the metal features and vias.

Embodiments of the present invention comprise depositing the metal silicide, e.g., tungsten silicide, by chemical vapor deposition (CVD) in a plurality of stages until the interconnect system is substantially completely lined. Each CVD stage comprises introducing a limited amount of gaseous reactants insufficient to completely line the interconnect system with the metal silicide, rapid heating to effect reaction and deposition of the metal silicide and removal of any unreacted gaseous components and by-products.

Embodiments of the present invention also include forming a dielectric sealing layer on the semiconductor substrate below the first patterned metal layer, and forming dielectric protective layers on the uppermost metal layer. Embodiments of the present invention further include employing a lead-rich glass, a benzocyclobutene (BCB) resin or low temperature silica as the ILD material, and employing silicon nitride or a composite of a hydrophobic layer on silicon nitride as the dielectric sealing layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
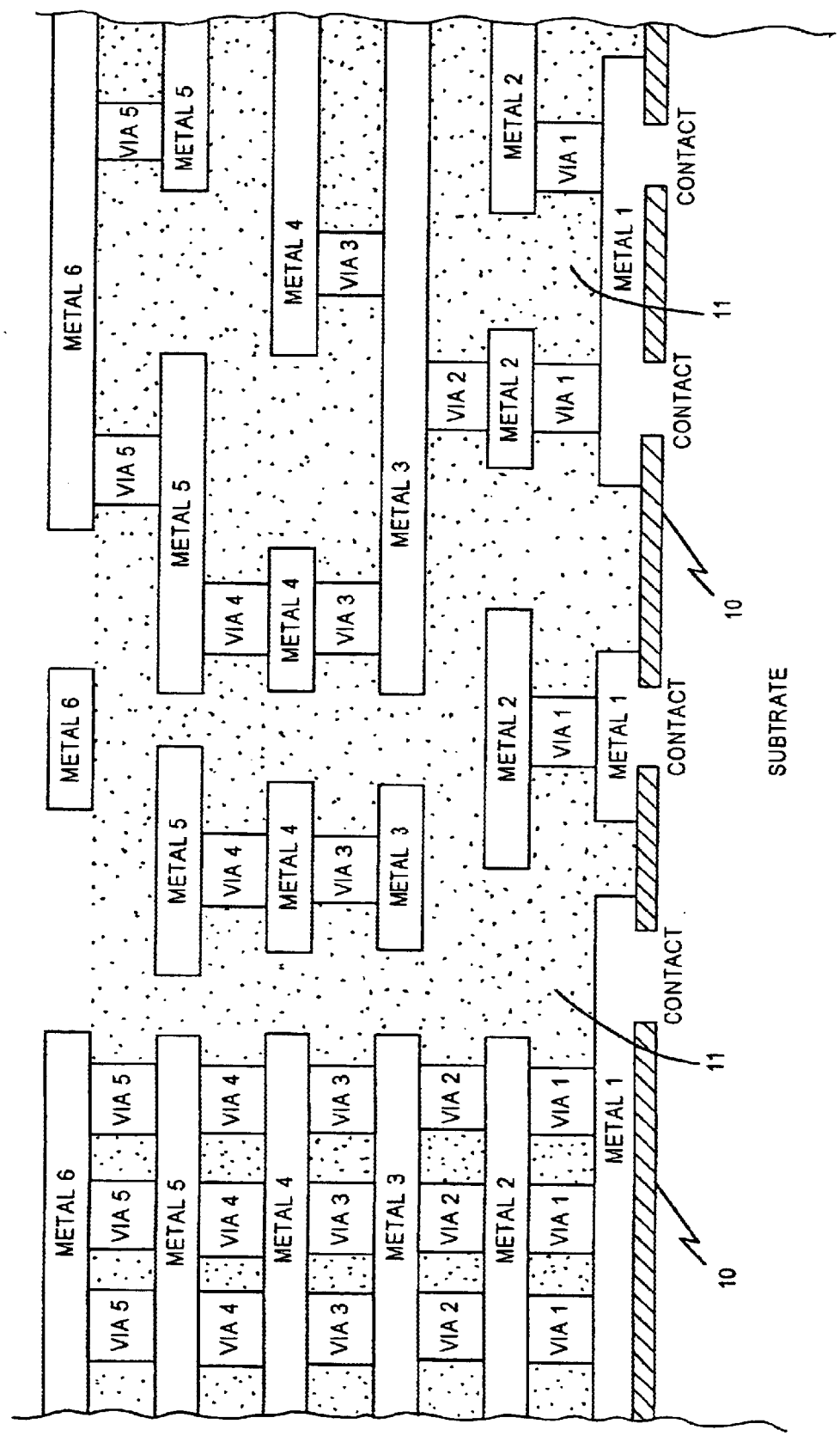
FIGS. 1–4 represent sequential phases of a method in accordance with an embodiment of the present invention, wherein like elements are denoted by like reference numerals.

The present invention addresses and solves problems attendant upon conventional multi-layer interconnection devices, particularly parasitic RC time delays. The capacitance, both layer-to-layer and within—layer, is primarily attributed to the film properties of the ILD. Prior attempts to remove ILDs by creating air tunnels or air gaps create significant structural integrity problems and result in a significant loss of electromigration resistance due to the exposed free surfaces of the conductors. The present invention enables the manufacture of semiconductor devices with a significantly reduced parasitic RC time delay by reducing both the layer-to-layer and within—layer capacitance without adversely impacting structural integrity and without lowering electromigration resistance.

In copending U.S. patent application Ser. No. 09/252,185 filed on Feb. 18, 1999 a multi-level semiconductor device is disclosed which exhibits reduced parasitic capacitance without any sacrifice in structural integrity or electromigration performance. The disclosed method comprises removing the inter-layer dielectrics and electroplating a hard metal, such as tungsten, as by pulse electroplating or electroless plating, to form a rigid, conductive liner on the interconnection system. In accordance with the method disclosed in copending U.S. patent application Ser. No. 09/252,184 filed on Feb. 18, 1999, tungsten is deposited by a conventional CVD process to line the interconnection system. The use of CVD advantageously enables efficient tungsten penetration into the convoluted, narrow passages of the interconnection system to provide a rigid, conductive lining with high electromigration resistance without contributing to inter-layer capacitance.

In accordance with the present invention, a metal silicide is deposited to form a rigid conductive liner on the interconnection system. Embodiments of the present invention comprise depositing a metal silicide, such as tungsten, cobalt, nickel, titanium, or tungsten silicide by CVD.

In an embodiment of the present invention, the conformality of metal silicide deposition is enhanced by conducting CVD in a plurality of stages during which a limited amount of metal silicide is deposited and unreacted gases and by-products are removed. For example, in forming a tungsten silicide liner, a limited amount of the gaseous reactants is introduced. Such gaseous reactants can comprise tungsten hexafluoride as a source of tungsten, silane as a source of silicon, and an inert carrier gas such as helium. Another gaseous reactant system can comprise tungsten hexafluoride as a source of tungsten, silicon chloride as a source of silicon and hydrogen gas. A limited amount of the gaseous reactant system, i.e., less than that sufficient to substantially completely line the interconnect system, is introduced and rapid heating is conducted, akin to rapid thermal annealing, to deposit a portion of the metal silicide on the interconnection system. Such a heating pulse can be at a temperature of about 400° C. to about 500° C. for about 10 seconds to about 50 seconds. A sufficient amount of time is then allowed for removal of any unreacted gaseous components or gaseous by-products, as by diffusion, typically about 30 seconds to about 60 seconds. Such removal can be facilitated by applying a vacuum or flushing with an inert gas, such as argon. This sequence is then repeated with the introduction of reactant gaseous, rapid heating and removal of unreacted components and by-products, until the interconnection system is substantially completely lined with metal silicide.

Embodiments of the present invention comprise removing the ILDs and subsequently lining the interconnection system, e.g., metal lines and vias, with the metal silicide by CVD. The resulting stiffened, metal silicide lined interconnection system comprises air gaps between the patterned metal layers, metal features and vias. The air gaps are, desirably, substantially continuous throughout the interconnection system and substantially reduce the capacitance of the interconnection system. The rigid, metal silicide liner enhances the structural integrity of the resulting semiconductor device and prevents a reduction in electromigration performance by encapsulating the exposed surfaces of the interconnection system.

Embodiments of the present invention comprise depositing a sealing layer either just above the local interconnect or first contact layer in the process sequence, e.g., on the semiconductor substrate below the first metallization layer. The sealing layer is ideally selected such that it is impermeable to the ILD removal technique employed. It is particularly suitable to form a sealing layer which rejects deposition of the subsequent conductive lining material. Suitable materials for the sealing layer include a silicon nitride.

Virtually any removable dielectric material can be employed in forming the ILDs in accordance with the present invention. It is desirable, however, to select dielectric materials which can be readily removed, e.g., dissolved, without damage to the metal conductors and which, themselves, will not be damaged or destroyed by conventional processing conditions, such as photoresist removal and metal etching. It has been found suitable to employ, as an ILD material, a lead-rich glass capable of being dissolved in acetic acid. Other suitable materials for the ILDs include a benzocyclobutene (BCB)-type resin which is stable with respect to an oxygen-containing plasma conventionally employed to remove photoresist material, but capable of being removed by exposure to a mixed oxygen-fluorine plasma. Another suitable material for the ILDs is a very soft, low density, silica deposited at a relatively low temperature and capable of being removed with a non-acidic or weakly acidic buffered hydrofluoric acid. The latter, relatively porous silica, is compatible with current manufacturing capabilities in that virtually no contamination is introduced.

Embodiments of the present invention also include depositing protective or passivation layers after depositing the liner on the conductors of the interconnection system. The protective or passivation layers are deposited above the uppermost patterned metal layer and serve as final protection against environmental contaminants. Penetration of the protective layers into the air gaps can be prevented by overlapping the features of the uppermost patterned metal layer with the features of the immediately underlying patterned metal layer. Another alternative comprises forming narrow gaps between the features of the uppermost patterned metal layer to prevent protective layer penetration. The protective layers include a bottommost protective layer having a thickness of about 5,000 Å to about 15,000 Å, e.g., about 8,000 Å to about 10,000 Å. Suitable materials for use as the bottommost dielectric protective layer include atmospheric pressure silane-base oxide depositions. A silicon nitride or silicon oxynitride layer is then deposited on the bottommost proactive layer.

An embodiment of the present invention is schematically illustrated in FIGS. 1–4. Referring to FIG. 1 there is schematically illustrated a substrate, the active regions omitted for illustrative clarity. Contacts to active regions are identified. A dielectric sealing layer 10 is formed on the substrate and the first patterned metal layer (Metal 1) formed thereon. Dielectric sealing layer can be formed at a thickness of about 300 Å to about 1,000 Å. The illustrated device comprises six patterned metal layers (identified as Metal 1–Metal 6)with five levels of conductive vias (identified as Via 1–Via 5) electrically interconnecting features on spaced apart patterned metal layers. The ILDs comprise dielectric material 11, such as silica, which appears throughout the interconnection structure.

Figure 2:
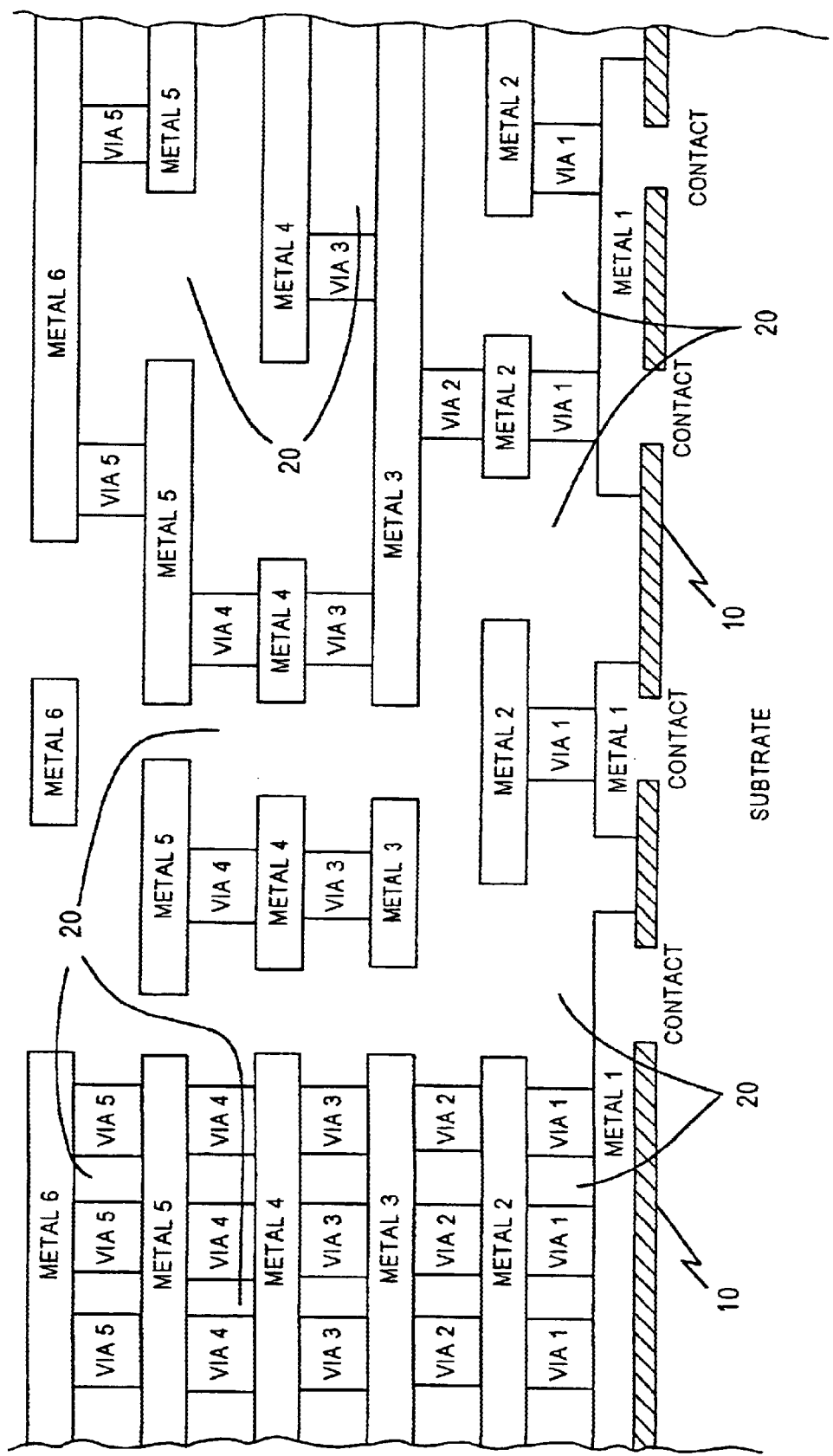

As shown in FIG. 2, the dielectric material 11 is removed, as with a slightly acidic buffered hydrofluoric acid solution, thereby creating voids or air gaps 20 throughout the interconnection structure. The formation of air gaps 20 significantly reduces the capacitance of the entire interconnection system as the dielectric constant of air is taken as one.

Figure 3:
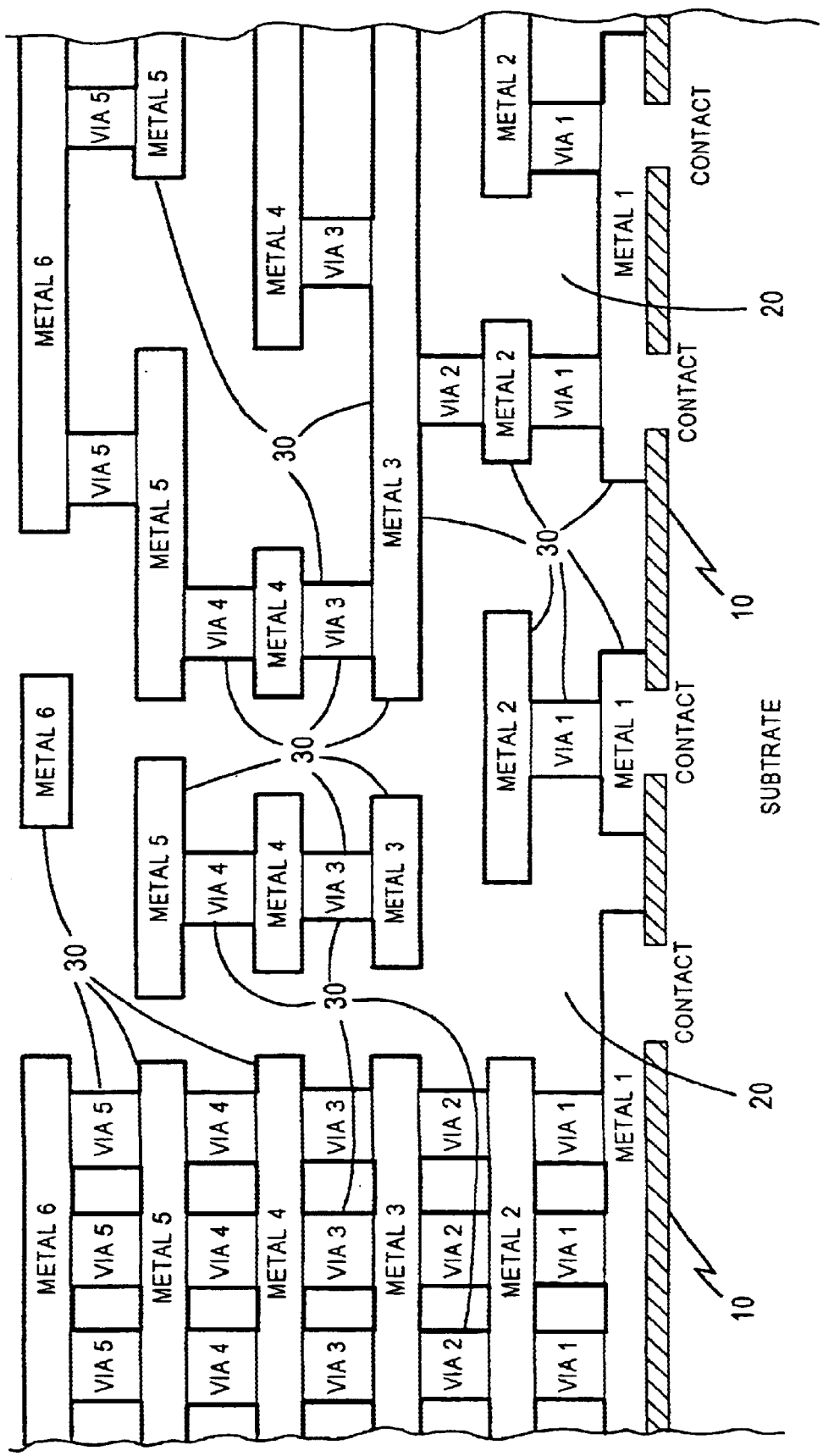
Figure 4:
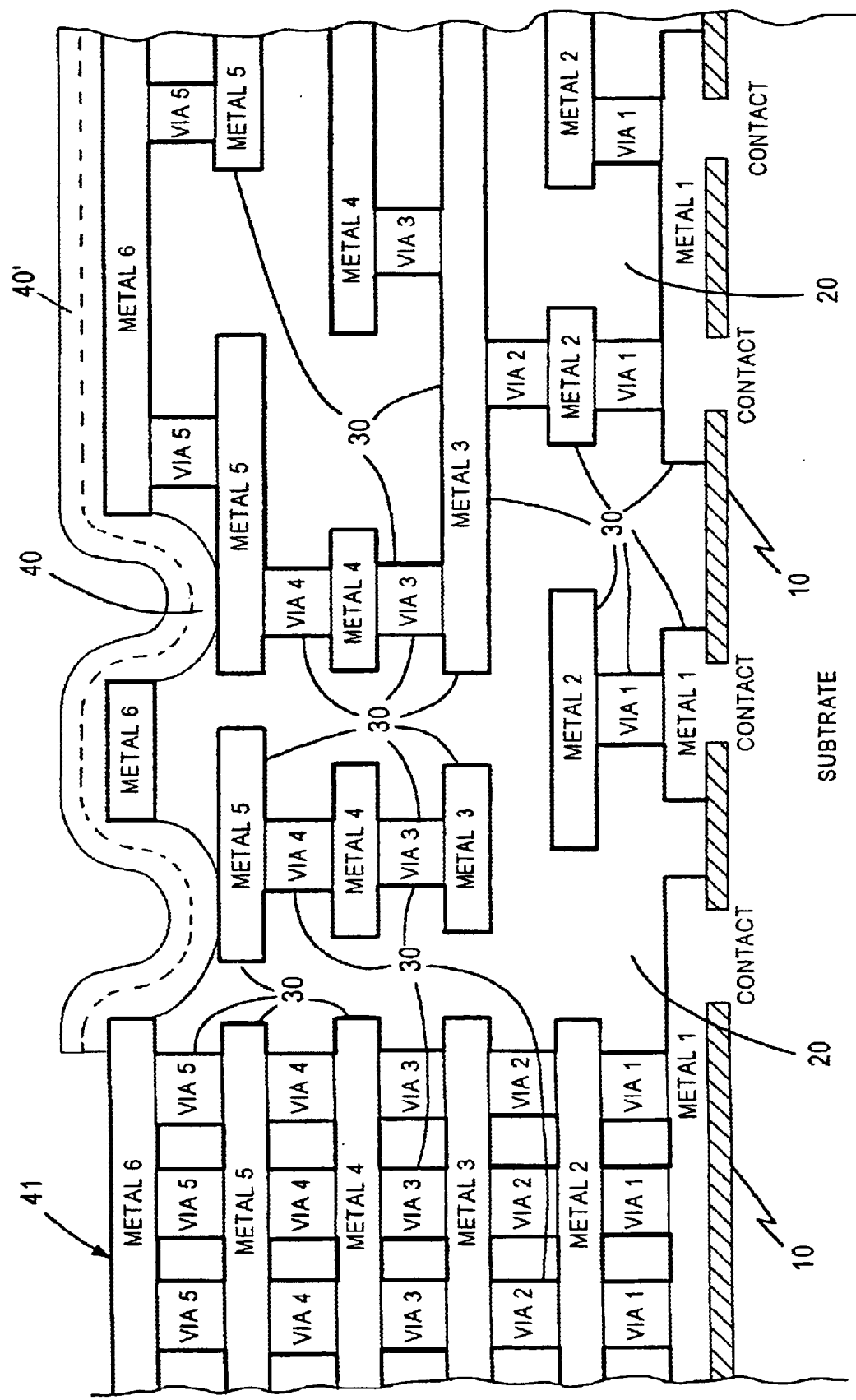

As shown in FIG. 3, a metal silicide liner 30, e.g., tungsten silicide, is deposited in a plurality of CVD stages with intermittent removal of unreacted components and by-products. The tungsten silicide penetrates throughout the interconnection system to substantially envelope the metal features and vias. Tungsten silicide liner 30 provides structural rigidity to the entire interconnection system while preventing a decrease in electromigration resistance of the interconnection components. Subsequently, as shown in FIG. 4, dielectric protective or passivation layers 40 are deposited to protect the device from environmental contaminants. Reference numeral 41 denotes the bonding pad area which is not covered by dielectric protective layers 40.

The present invention provides efficient, cost effective methodology for manufacturing highly integrated semiconductor devices exhibiting increased circuit speed by significantly reducing the capacitance of the interconnection system without adversely impacting structural integrity or electromigration performance. The present invention includes the use of various metals for the interconnection system, such as aluminum, aluminum alloys, copper, copper alloys, as well as tungsten plugs in forming vias. Patterned metal layers can be formed in any conventional manner, as by blanket deposition and etch back techniques or damascene techniques, including single and dual damascene techniques.

The present invention is industrially applicable to the manufacture of any of various type of semiconductor devices. The present invention enjoys particular applicable in manufacturing highly integrated, multi-level semiconductor devices having submicron features, e.g. a design rule of less than about 0.18 micron.

Only the preferred embodiment of the present invention and but a few examples of its versatility are shown and described in the present disclosure. It is to be understood that the present invention is capable of using various other combinations and environments and is capable of changes or modifications within the scope of the inventive concept as expressed herein.

What is claimed is:

1. A semiconductor device comprising:
    a substrate having active regions; and
    an interconnection system comprising:
        a first patterned metal layer, comprising metal features, over the substrate;
        a plurality of patterned metal layers, each patterned metal layer containing metal features, above the first patterned metal layer terminating with an uppermost patterned metal layer;
        vias electrically connecting metal features of different patterned metal layers;
        contacts electrically connecting active regions to metal features of the first patterned metal layer;
        air gaps between the patterned metal layers, metal features, and vias; and
        a metal silicide liner on the metal features and vias, wherein the air gaps are substantially continuous throughout the interconnection system.

2. The semiconductor device according to claim 1, further comprising a dielectric sealing layer between the substrate and first patterned metal layer.

3. The semiconductor device according to claim 2, further comprising dielectric protective layers on the uppermost patterned metal layer.

4. The semiconductor device according to claim 3, wherein the metal silicide liner comprises cobalt, nickel, titanium, or tungsten silicide.

5. The semiconductor device according to claim 4, wherein the metal silicide liner comprises tungsten silicide.

6. The semiconductor device according to claim 4, wherein the metal silicide liner has a thickness of about 500 Å to about 1,000 Å.

7. The semiconductor device according to claim 5, wherein the dielectric sealing layer comprises a silicon nitride.

8. The semiconductor device according to claim 7, wherein the dielectric sealing layer has a thickness of about 500 Å to about 1,000 Å.

9. The semiconductor device according to claim 7, wherein the dielectric protective layers comprise a bottommost protective layer of an oxide.

10. The semiconductor device according to claim 8, wherein the protective oxide layer has a thickness of about 10,000 Å to about 25,000 Å.

11. The semiconductor device according to claim 1, wherein the metal silicide liner provides structural rigidity to the interconnection system while preventing a decrease in electromigration resistance.

12. The semiconductor device according to claim 1, wherein the metal silicide liner substantially envelops the metal features and vias.

13. A method of manufacturing a semiconductor device, the method comprising:
    forming a substrate with active regions;
    forming an interconnection system comprising:
        a first patterned metal layer, over the substrate, having metal features electrically connected to the active regions by contacts;
        a plurality of patterned metal layers over the first patterned metal layer terminating with an upper most patterned metal layer, each patterned metal layer having metal features electrically connected to metal features of different patterned metal layers by vias; and
        an inter-layer dielectric between the patterned metal layers;
    removing the inter-layer dielectrics so that substantially continuous air gaps are formed throughout the interconnection system between the patterned metal layers, metal features, and vias;
    depositing a metal silicide to form a liner on the metal features and vias.

14. The method according to claim 13, comprising depositing the metal silicide liner by chemical vapor deposition.

15. The method according to claim 13, further comprising:
    forming a dielectric sealing layer on the substrate; and
    forming the first patterned metal layer on the dielectric sealing layer.

16. The method according to claim 15, further comprising forming a dielectric protective layer on the uppermost patterned metal layer.

17. The method according to claim 16, comprising:
    forming the inter-layer dielectrics by depositing layers of a: lead-rich glass soluble in acetic acid; benzocyclobutene resin; or silica at a temperature less than about 400° C.; and
    removing the inter-layer dielectrics.

18. The method according to claim 15, wherein the dielectric sealing layer comprises a silicon nitride.

19. The method according to claim 16, wherein the dielectric protective layers comprise a bottommost protective layer of an oxide.

20. The method according to claim 14, comprising depositing tungsten, cobalt, nickel, titanium, or tungsten silicide by chemical vapor deposition to form the liner.

21. The method according to claim 20, comprising depositing tungsten silicide to form the liner.

22. The method according to claim 20, comprising chemical vapor depositing the metal silicide by:
    (a) introducing gaseous reactants in an amount less than necessary to completely line the interconnection system;
    (b) rapidly heating to effect reaction of the gaseous reactants and deposit the metal silicide;
    (c) removing any unreacted gases and any by-products; and
    (d) repeating steps (a) through (d) until the interconnection system is substantially completely lined.

23. A semiconductor device comprising:
    a substrate having active regions; and
    an interconnection system comprising:
        a first patterned metal layer, comprising metal features, over the substrate;
        a plurality of patterned metal layers, each patterned metal layer containing metal features, above the first patterned metal layer terminating with an uppermost patterned metal layer;

vias electrically connecting metal features of different patterned metal layers;

contacts electrically connecting active regions to metal features of the first patterned metal layer;

air gaps between the patterned metal layers, metal features, and vias; and a metal silicide liner on the metal features and vias, wherein the metal silicide liner comprises cobalt, nickel or titanium silicide.

24. The semiconductor device according to claim 23, wherein the air gaps are substantially continuous throughout the interconnection system.

25. The semiconductor device according to claim 24, wherein the metal silicide liner substantially envelopes the metal features and vias.

26. The semiconductor device according to claim 23, further comprising a dielectric sealing layer between the substrate and first patterned metal layer.

27. The semiconductor device according to claim 26, further comprising dielectric protective layers on the uppermost patterned metal layer.

28. A semiconductor device comprising:

a substrate having active regions; and an interconnection system comprising:

a first patterned metal layer, comprising metal features, over the substrate;

a plurality of patterned metal layers, each patterned metal layer containing metal features, above the first patterned metal layer terminating with an uppermost patterned metal layer;

vias electrically connecting metal features of different patterned metal layers;

contacts electrically connecting active regions to metal features of the first patterned metal layer;

air gaps between the patterned metal layers, metal features, and vias; and a metal silicide liner on the metal features and vias, wherein the metal comprises aluminum, an aluminum alloy, copper, or a copper alloy.

29. The semiconductor device according to claim 28, further comprising a dielectric sealing layer between the substrate and first patterned metal layer.

30. The semiconductor device according to claim 29, further comprising dielectric protective layers on the uppermost patterned metal layer.

31. The semiconductor device according to claim 30, wherein the metal silicide liner comprises cobalt, titanium, or tungsten silicide.

* * * * *